US010310822B1

(12) United States Patent
Hein et al.

(10) Patent No.: US 10,310,822 B1
(45) Date of Patent: Jun. 4, 2019

(54) METHOD AND SYSTEM FOR SIMULATING A CONTROL PROGRAM

(71) Applicant: dSPACE digital signal processing and control engineering GmbH, Paderborn (DE)

(72) Inventors: Renata Hein, Paderborn (DE); Wolfgang Trautmann, Paderborn (DE); Sebastian Hillebrand, Marsberg (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 0 days.

(21) Appl. No.: 15/827,196

(22) Filed: Nov. 30, 2017

(51) Int. Cl.
*G06F 9/44* (2018.01)
*G06F 8/34* (2018.01)
*G06F 17/50* (2006.01)
*G06F 8/41* (2018.01)
*G06F 8/33* (2018.01)

(52) U.S. Cl.
CPC .................. *G06F 8/34* (2013.01); *G06F 8/33* (2013.01); *G06F 8/41* (2013.01); *G06F 17/5009* (2013.01)

(58) Field of Classification Search
CPC ........................................................ G06F 8/34
See application file for complete search history.

(56) References Cited

U.S. PATENT DOCUMENTS 6,795,963 B1 * 9/2004 Andersen ............ G06F 11/3628 714/E11.209
6,971,065 B2 * 11/2005 Austin ................ G06F 9/44505 709/217
8,402,438 B1 * 3/2013 Andrews ............. G06F 11/3676 717/126
9,043,759 B1 * 5/2015 Lininger ............. G06F 11/3684 717/106
2004/0107085 A1 * 6/2004 Moosburger ........ G06F 17/5009 703/13
2007/0032922 A1 * 2/2007 Gvillo ....................... G06F 8/30 701/3
2012/0072889 A1 * 3/2012 Dove ........................ G06F 8/34 717/140

OTHER PUBLICATIONS

Hanselmann et al., "Production Quality Code Generation from Simulink Block Diagrams," Proc. of IEEE Int'l Symp. on Computer-Aided Control System Design, pp. 213-218 (Aug. 1999).

* cited by examiner

*Primary Examiner* — Hang Pan
(74) *Attorney, Agent, or Firm* — Muncy, Geissler, Olds & Lowe, P.C.

(57) ABSTRACT

A method for simulating a program modeled as one or more blocks of a block diagram in a technical computing environment. A block diagram is opened in a model editor. Source code is generated for the one or more blocks of the block diagram using the code generator. The program is configured from the source code using a predefined compiler in order to generate a binary executable file, and the program is simulated, which comprises running at least one function in the auxiliary file in order to determine at least the width of a basic data type corresponding to the enumeration variable in the binary executable file, and allocating one or more variables based on the determined byte width in order to log the simulation results.

16 Claims, 4 Drawing Sheets

METHOD AND SYSTEM FOR SIMULATING A CONTROL PROGRAM

BACKGROUND OF THE INVENTION

Field of the Invention

The present invention relates to a method and computer system for automatically generating code from block diagrams, the code being used in, for example, electronic control units.

Description of the Background Art

Electronic control units (abbreviated as ECUs) are ubiquitous especially in automotive applications; generally, they may contain a processor, in particular a microcontroller, one or more sensor interfaces and one or more circuits to control an actuator. Current parameters of a physical process are preferably determined using the signals of the one or more sensors connected to the sensor interfaces. Based on a predefined control strategy, the processor may control the one or more circuits to apply the actuators in order to influence the physical process. For example, an ECU may be used to perform anti-lock braking, with a sensor measuring the wheel velocity and a magnetic valve reducing the pressure in the corresponding wheel brakes.

In order to speed up the development process for ECUs, control strategies are preferably developed using block diagrams in a technical computing environment (abbreviated as TCE), which allows for tracing the temporal behavior of a physical system described by one or more blocks in the block diagram. One particular example of a TCE is MATLAB/Simulink of The MathWorks.

The document "Production Quality Code Generation from Simulink Block Diagrams", Proceedings of the 1999 IEEE International Symposium on Computer Aided Control System Design, Kohala-Coast, Hawai'i, USA, by H. Hanselmann et al. describes a system for automatically generating production code based on a block diagram containing one or more blocks that specify the functionality of the program. The program may in particular be a control program for an ECU, the control program implementing the desired control strategy.

Generally, input signals or output signals of a control program may be (quasi-)continuously varying; on the other hand, some signals or parameters only take on a finite number of predefined values. For improved readability, such a signal or parameter may be modeled as an enumeration. When a source code representation of the program is generated and compiled for the desired target platform, the enumeration variable is mapped to an a priori unknown basic data type. Especially the C language standard leaves the choice of the basic data type to the compiler.

Thus, improved methods for generating source code for a program containing enumeration variables are needed; in particular, it would be desirable to determine the underlying basic data type of an enumeration variable before running a simulation of the program.

SUMMARY OF THE INVENTION

It is therefore an object of the present invention to provide a method and computer system for automatically generating source code from a block diagram comprising a detailed implementation of the program.

In an exemplary embodiment of the invention, a computer-implemented method for simulating a program is provided, the program being modeled as one or more blocks of a block diagram in a technical computing environment, the one or more blocks comprising at least one signal or parameter that is marked as an enumeration, the technical computing environment comprising a model editor, a data definition tool and a code generator. The method includes: opening the block diagram in the model editor; generating source code for the one or more blocks of the block diagram using the code generator, wherein generating source code comprises converting the at least one signal or parameter to an enumeration variable in the source code and storing information on the source code in the data definition tool, the information comprising the defined type of the enumeration variable in the source code; when the source code comprises multiple enumeration variables, the stored information preferably comprises the name and the corresponding defined type of each enumeration variable; building the program from the source code using a predefined compiler in order to generate a binary executable file, wherein building the program comprises generating an auxiliary file based on the information in the data definition tool, wherein the auxiliary file is built to be a standalone binary executable file or integrated into the binary executable file of the program; and/or simulating the program, wherein the simulating comprises running at least one function in the auxiliary file in order to determine at least the byte width of a basic data type corresponding to the enumeration variable in the binary executable file, and allocating one or more variables based on the determined byte width, preferably in order to log the value of the enumeration variable.

In an embodiment of the invention, a method for generating source code for a program is provided, the program being modeled as one or more blocks of a block diagram in a technical computing environment, the one or more blocks of the model comprising at least one signal or parameter that is marked as an enumeration, the technical computing environment comprising a model editor, a data definition tool and a code generator. The method includes: opening the block diagram in the model editor; generating source code for the one or more blocks of the block diagram using the code generator, wherein generating source code comprises converting the at least one signal or parameter to an enumeration variable in the source code and storing information on the source code in the data definition tool, the information comprising the defined type of the enumeration variable in the source code; when the source code comprises multiple enumeration variables, the stored information preferably comprises the name and the corresponding defined type of each enumeration variable; building the program from the source code using a predefined compiler in order to generate a binary executable file, wherein building the program comprises generating an auxiliary file based on the information in the data definition tool, wherein the auxiliary file is built to be a standalone executable or integrated into the binary executable file of the program; simulating the program, wherein the simulating comprises transferring the binary executable file to the embedded system, running at least one function in the auxiliary file in order to determine the width of the basic data type corresponding to the enumeration variable in the binary executable file, storing information on the enumeration variable in the data definition tool, comprising the determined byte width or a determined basic data type or both, and running the binary executable file on the target processor; receiving user input indicating that a variable description file is to be generated;

and/or generating a variable description file for the program, the variable description file comprising information on the enumeration variable, wherein at least the determined byte width or the determined basic data type is retrieved from the data definition tool. When the predefined compiler is adapted to the target microcontroller of the embedded system and the compiler options are kept unchanged, the variable description file generated for the processor-in-the-loop simulation may also be used for the production software, i.e. the binary executable firmware of a production ECU. Thus, the variable description file may e.g. be used for bypassing applications or calibrating parameters in the production software.

The steps of the methods may be carried out by a processor running different software components, such as parts of the technical computing environment, on a host computer, the software components preferably using the mechanisms of the technical computing environment or of the operating system of the host computer to exchange data and/or cause the execution of one or more further software components. The host computer may be realized as a single standard computer comprising a processor, in particular a high-speed general-purpose microprocessor, a display device and an input device. Alternatively, the host computer system may comprise one or more servers comprising one or more processing elements, the servers being connected to a client comprising a display device and an input device via a network. Thus, the technical computing environment may be executed partially or completely on a remote server, such as in a cloud computing setup. A graphical user interface of the technical computing environment may be displayed on a portable computing device, in particular a computing device with a touch screen interface. In this case, it is particularly advantageous when the computations for executing the block diagram are carried out on a remote server. The technical computing environment may comprise a graphical user interface for modifying the block diagram and a simulation engine for executing the block diagram, so that the dynamical system described by the block diagram can be simulated. The block diagram may comprise multiple blocks with input and/or output signals that are connected to output and/or input signals of other blocks. Each block may be an atomic functional unit or may be a hierarchical block that is composed of a plurality of subordinate blocks.

The term program can refer to the functionality to be performed by the electronic control unit; it may be represented as a block diagram, a source code generated from the block diagram, or as binary executable file resulting from a compilation of the generated source code.

The source code generated for a signal marked as an enumeration may resemble the following example:

```
typedef enum Days_tag {
Monday=0,
Tuesday=1,
Wednesday=2,
Thursday=3,
Friday=4,
Saturday=5,
Sunday=6
} Days; /* Description: C enum */Days
Sa1_Monday;
```

When the generated source code is compiled, the defined enumeration type is mapped to a basic data type. For the C language, there is no fixed rule regarding the underlying basic data type of an enumeration variable; both signed and unsigned integers of different byte width may be used. The basic data type comprises information on the determined byte width and on the fact if signed integers or only unsigned integers may be represented. Choice of the byte width may depend on the size of words in the target platform, such as 32 bit (4 byte) or 64 bit (8 byte), depending on whether the processor of the target platform has a 32-bit or a 64-bit architecture; further, it may depend on compiler options. Thus, the basic data type cannot be derived from the block diagram by the code generator. This holds true irrespective of whether the signal marked as an enumeration has a constant value.

A simulation of the program in a software-in-the-loop or processor-in-the-loop mode requires generating code, compiling the generated code, linking the binary files to a simulation application and transferring the simulation application to the simulation platform, i.e. the host computer or an embedded system. Prior to the long-term repeated execution in the different time steps, the simulation application may be initialized. Initializing a simulation by running a function in the auxiliary file allows for determining the byte width before running the simulation using predefined stimuli. Preferably, initializing the simulation comprises calculating the address for at least one input variable or output variable that is to be logged.

By running a function in the auxiliary file, the invention allows for an accurate determination of the current byte width for the enumeration variables used in the block diagram of the program. Because the byte width of the enumeration variable is known, there is no need to allocate additional memory "just in case". This is particularly useful, when a plurality of values is logged during a long-term simulation and/or when a plurality of enumeration values is used in the block diagram. An additional function may be executed for multiple enumeration types in the auxiliary file; the auxiliary file may contain multiple additional functions or one additional function determining the basic data type for multiple enumeration types.

Determining the byte width can comprise determining whether the basic data type is signed or unsigned. Knowing if the basic data type is signed can be necessary for instance in order to transform a logged variable to the underlying physical quantity.

The method also comprises storing information on the determined byte width, the determined basic data type or both in the data definition tool. When the information on a specific variable is stored and referenced to the identifier of the signal or variable, any software component with an interface to the technical computing may retrieve the information. The basic data type, or at least the byte width, of an enumeration variable is useful for logging that variable or calculating the addresses of components of a structured variable, such as an array or struct in the C language, comprising at least one enumeration component.

Simulating the program can comprise executing the built program on the host computer, logging or extracting the values of one or more of the variables of the program during execution, including at least one enumeration variable, and displaying or storing the logged simulation results. The determined byte width or the determined basic data type may be used for calculating the address values of input/output variables of the program and/or writing the new input value to the program or reading the output values from the program.

The predefined compiler can be adapted to generate instruction for a target processor differing from the processor of the host computer, and an embedded system comprising a target processor is connected to the host computer. In this use case, a processor-in-the-loop simulation, simulating the program comprises transferring the binary executable file to the embedded system, running the binary executable file on the target processor, logging or extracting the values of one or more of the variables of the program during execution, including at least one enumeration variable, and storing or displaying the logged values on the host computer.

When the enumeration variable is part of a structured variable, the method can further comprise calculating or determining address offset values for accessing the different components of the structured variable, and storing the address offset values in the definition tool. The source code for a structured signal may resemble the following example:

```
typedef struct {
Int16 comp_1
Days comp_2
UInt8 comp_3
} MyStruct
MyStruct StructVar;
```

Generally, a mapping file created when compiling the source code only contains the start address of StructVar. In order to access StructVar.comp_3, the byte width of the enumeration variable is needed. The method provides a comfortable way for determining this byte width before simulating the program.

When the program comprises a structured variable, the method comprises determining address offset values for accessing the different components of the structured variable and storing the determined address offset values in the data definition tool or the variable description file. The auxiliary file may also comprise at least a function for determining information on structured variables. The additional function for a structured variable type may comprise defining a variable of the structured variable type and calculating or determining address values for the different components of the variable. The offsets for the components of the structured variable may be stored in the data definition tool.

For the structured variable defined above, the additional function in the auxiliary file may comprise instructions such as:

```
unsigned int offset_2;
offset_2=(unsigned int)&StructVar.comp_2-(unsigned int)&StructVar;
```

Depending on the selected options, the compiler may or may not align the different components of a structured variable to words of the target processor. Using the additional function, the address offsets can be determined correctly without assumptions.

In an embodiment of the invention, a method for simulating a program is provided, the program being modeled as one or more blocks comprising at least one structured signal or parameter with multiple components. When a processor of the host computer generates code for the program, the at least one signal or parameter is converted to a structured variable in the source code and information on the source code is stored in the data definition tool, the information comprising the names of the components of the structured variable in the source code; preferably the defined type of the structured variable is also stored in the data definition tool. The processor generates an auxiliary file based on the information in the data definition tool, and simulates the program. When initializing the simulation, the processor runs at least one function in the auxiliary file in order to determine address offset values for the components of the structured variable in the binary executable file, and accesses at least one component of the structured variable. The method allows for determining address offsets of the different components in the structured variable.

In an embodiment of the invention, a method for generating source code for a program is provided, the program being modeled as one or more blocks of a block diagram in a technical computing environment, the one or more blocks of the model comprising at least one structured signal or parameter that comprises multiple components. From the at least one signal or parameter, a processor of the host computer generates a structured variable in the source code and storing information in the data definition tool, the information comprising the names of the components of the structured variable; preferably the defined type of the structured variable is also stored in the data definition tool. The processor builds the program from the source code for a target microcontroller and generates an auxiliary file based on the information in the data definition tool. The binary executable file of the program is transferred to an embedded system comprising the target microcontroller; the microcontroller runs at least one function in the auxiliary file in order to determine address offset values for the components of the structured variable in the binary executable file. The determined address offsets are transmitted to the host computer, and information on the structured variable is stored in the data definition tool, comprising the determined address offset values of the components. When the processor generates a variable description file for the program, the variable description file comprising information on the structured variable, at least the address offsets of the components are retrieved from the data definition tool. By keeping the compiler options unchanged, the variable description file generated for the processor-in-the-loop simulation may also be used for the production software, i.e. the binary executable firmware of a production ECU.

An embodiment of the invention also relates to a non-transitory computer readable medium containing instructions that, when executed by a microprocessor of a computer system, cause the computer system to carry out the method as described above or in the appended claims.

In an embodiment of the invention, a computer system is provided which comprises a processor, a random access memory, a graphics controller connected to a display, a serial interface connected to at least one human input device, and a nonvolatile memory, in particular a hard disk or a solid-state disk. The nonvolatile memory comprises instructions that, when executed by the processor, cause the computer system to carry out the method.

The processor may be a general-purpose microprocessor that is customary used as the central processing unit of a personal computer or it may comprise one or a plurality of processing elements adapted for carrying out specific calculations, such as a graphics-processing unit. In alternative embodiments of the invention, the processor may be replaced or complemented by a programmable logic device, such as a field-programmable gate array, which is configured to provide a defined set of operations and/or may comprise an IP core microprocessor.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
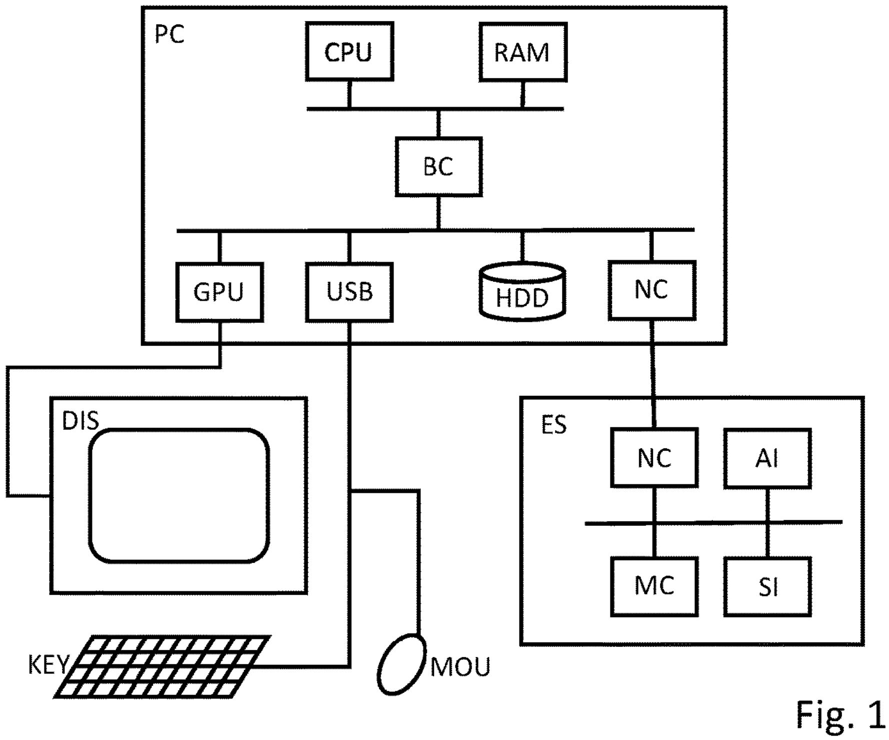
FIG. 1 is an exemplary diagram of a computer system.

FIG. 1 illustrates an exemplary embodiment of a computer system.

The shown embodiment comprises a host computer PC with a display DIS and human interface devices such as a keyboard KEY and a mouse MOU; further, an embedded system ES is depicted, which may e.g. be used for a processor-in-the-loop simulation.

The host computer PC comprises at least one processor CPU with one or multiple cores, a random access memory RAM and a number of devices connected to a local bus (such as PCI Express), which exchanges data with the CPU via a bus controller BC. The devices comprise e.g. a graphics-processing unit GPU for driving the display, a controller USB for attaching peripherals, a non-volatile memory HDD such as a hard disk or a solid-state disk, and a network interface NC. Preferably, the non-volatile memory comprises instructions that, when executed by one or more cores of the processor CPU, cause the computer system to carry out a method according to one of the claims.

The embedded system ES comprises a network interface NC, an actuator interface AI and a sensor interface SI as well as a microcontroller MC. As an alternative or addition to the microcontroller MC, the embedded system ES may comprise a programmable logic device such as a field-programmable gate array. The programmable logic device may contain a hardwired digital signal processor and it may be configured to comprise an IP core microprocessor. Preferably, the embedded system ES is connected to the personal computer PC via the network interface NC, which may e.g. be of USB, RS-232 or Ethernet type. The embedded system may comprise a non-volatile memory that comprises instructions to be carried out by the microcontroller or a configuration to be loaded on the programmable logic device.

In an embodiment, the host computer may comprise one or more servers comprising one or more processing elements, the servers being connected to a client comprising a display device and an input device via a network. Thus, the technical computing environment may be executed partially or completely on a remote server, such as in a cloud computing setup. A personal computer may be used as a client comprising a display device and an input device via a network. Alternatively, a graphical user interface of the technical computing environment may be displayed on a portable computing device, in particular a portable computing device with a touch screen interface or a virtual reality device.

In an embodiment, the computer system does not comprise an embedded system ES. While the embedded system ES is useful for carrying out a processor-in-the-loop simulation of a control program, the presence of an embedded system may not be necessary for carrying out at least some aspects of the present invention.

Figure 2:
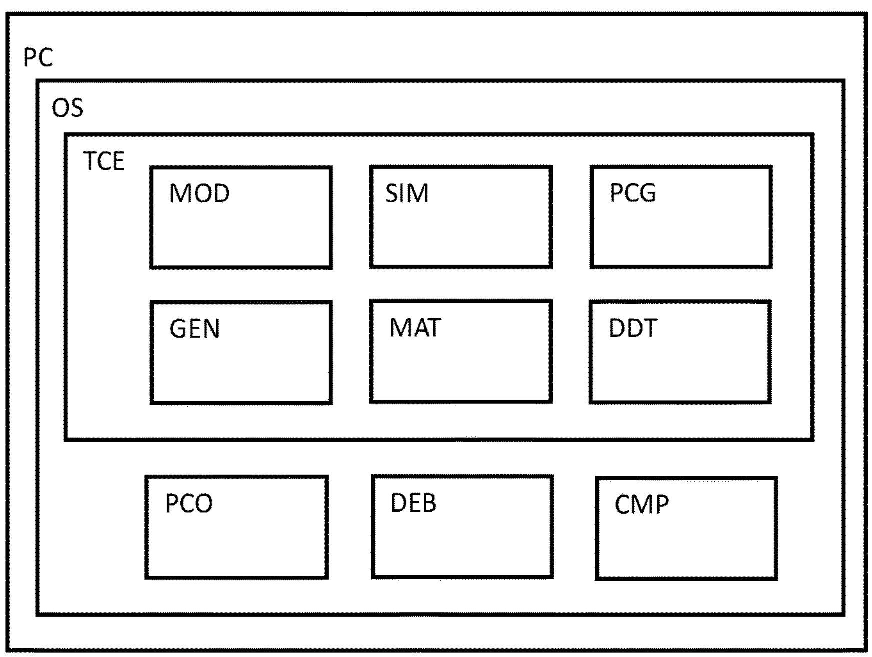
FIG. 2 is an exemplary diagram of software components in a computer system.

FIG. 2 displays an exemplary embodiment of the software components being executed on a computer system, which may be realized as a host computer PC with a standard microprocessor that runs a standard operating system OS such as Microsoft Windows or a Linux distribution.

On the host computer PC, a technical computing environment TCE such as MATLAB/Simulink of The MathWorks may be installed. Other examples of technical computing environments comprise LabVIEW of National Instruments or ASCET of ETAS. The technical computing environment TCE comprises a plurality of software components such as a model editor MOD and a simulation engine SIM. Additionally, the TCE may comprise a mathematical and/or script interpreter MAT that is adapted for carrying out calculations or modifying data. The TCE comprises a production code generator PCG that is adapted to produce production code from a model; further, it comprises a documentation generator and it may comprise a data definition tool DDT. The expression that a software component is comprised in the TCE is intended to encompass the case that the software component uses a specific mechanism of the TCE such as an application-programming interface of the TCE in order to exchange data and/or instructions with other software components in the TCE. For example, a software component may be realized as or comprise an add-on such as a toolbox for the model editor.

The model editor MOD may provide a graphical user interface for creating and modifying block diagrams that preferably describe the temporal behavior of a dynamic system. Additionally, blocks adapted for describing finite states and conditions for transitions between states may be used to model the dynamic system. A block may describe an atomic operation, such as an arithmetic calculation or a logic expression, or it may represent a subsystem that is described in more detail by an additional or partial block diagram in a subordinate hierarchical level. This need not imply that the partial block diagram is stored in a separate file, but rather that the functionality of a hierarchical block is defined by a plurality of blocks in a subordinate level. Alternatively, it may contain code in a higher-level programming language, in particular a dynamic language intended for mathematical programming, that realizes the block's functionality. Multiple blocks may be connected by signals for the exchange of data. For example, an initial block may receive a signal of type single as input signal, may modify the signal e.g. by adding a constant and may send an output signal of type double to a further block. It may be said that the further block is downstream of the initial block because they are connected by a signal path so that data flows from the initial block to the further block.

The simulation engine SIM may be adapted to execute a block diagram created in the model editor MOD in order to observe the temporal behavior of the dynamic system described by the block diagram. The execution of a block diagram may also be called a model-in-the-loop simulation of the dynamic system and is preferably carried out using high-precision operations in order to observe the behavior more closely and to create reference data.

The production code generator PCG allows for creating production code from one or more blocks in a block diagram. Production code may be optimized for readability, traceability, safety, low-energy consumption, execution speed and/or memory requirements. Preferably, the code generator provides a user interface for setting a plurality of options for adapting the customization of the generated code. Customization options may include target-specific optimizations for the microcontroller of the embedded system and enforcing compliance of the generated code to a specific standard, such as the MISRA C guidelines. A particularly preferred production code generator PCG is TargetLink of dSPACE.

The data definition tool DDT provides a local or remote database for storing definitions and parameters as well as an application-programming interface for automatic exchange of the data between different software components. The term "database" is to be understood preferably in a broad sense, so that a file with a tree structure may be considered a database. A data definition tool allows for a clean separation of the model of the dynamic system given in the block diagram from implementation-specific details stored in the database. When a complex model is structured in different sub-models, data in different sub-models may be linked. By storing corresponding information in the data definition tool, these dependencies may be automatically resolved. Additionally, by exchanging data with a software architecture tool, such as SystemDesk of dSPACE, the data definition tool DDT can be used as part of a higher-level tool chain, in particular to generate product code compliant to the AUTOSAR standard. A preferred data definition tool is TargetLink Data Dictionary of dSPACE.

The documentation generator GEN is adapted to traverse the block diagram and generate a documentation based on the definitions in the documentation blocks. The documentation may comprise information from the data definition tool DDT and/or data from external data sources.

Other software components such as a production code compiler PCO, a debugger DEB or a comparison tool CMP may also be installed on the computer. These software components may be interfaced to each other and/or the technical computing environment using standard mechanisms of the underlying operating system OS. The compiler PCO may generate an executable for the microprocessor of the PC or it may generate an object code for the microcontroller of the embedded system. Additionally, it may be configured to generate additional debugging information and to include it in the executable. In this way, the debugger DEB can e.g. be used for observing the value of a signal during a software-in-the-loop simulation of the generated production code. Depending on the intended use, the observed values may be directly displayed to the user and/or they may be logged in a memory, e.g. in RAM, in a file or a database.

Figure 3:
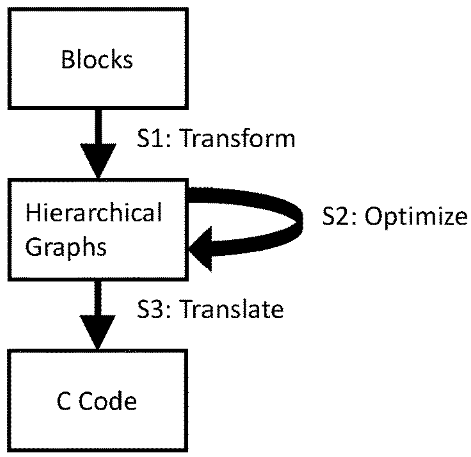
FIG. 3 is an exemplary diagram of a method for generating production code from a block diagram.

FIG. 3 illustrates an exemplary embodiment of the generation of production code from one or more blocks in a block diagram. The following steps are preferably carried out by a microprocessor on the host computer; alternatively, a client server setup may be used so that computationally expensive steps are carried on a remote server containing a plurality of microprocessors.

In a first step S1, the selected one or more blocks (or, if selected, the entire block diagram) and related input data are transformed to an intermediate representation such as one or more hierarchical graphs. These hierarchical graphs may in particular comprise a data flow graph, a control flow graph and/or a tree structure. Related input data may e.g. be extracted from a database associated with the block diagram. This may encompass situations where elements of the block diagram are created based on information from a data definition tool, or where settings relevant for the production code generation are retrieved from the data definition tool.

In a second step S2, the hierarchical graphs are optimized in order to reduce the number of variables required and/or the number of operations or instructions to be carried out. This optimization may comprise a plurality of intermediate steps on further intermediate representations between block level and production code level. In each step, an initial set of hierarchical graphs or an intermediate language is converted to a modified set of hierarchical graphs or an intermediate language while applying one or more optimization rules. A number of strategies such as constant folding or elimination of dead code may be applied during optimization.

In a third step S3, the optimized intermediate representations such as optimized hierarchical graphs are translated to code in a high-level or low-level programming language, preferably C code. The code may be further optimized in this step and restricted to a subset of the linear or parallel programming language, the control and dataflow structures may be restricted to precisely specified variants, the scope of functions and data may be restricted according to accurately specified rules. Alternatively or in addition, additional information may be added to the code, e.g. in the form of comments, to enhance readability or help in debugging the code.

During or after the code generation, information on the current block diagram or the code generation, especially results of the code generation, may again be stored in a database such as the data definition tool. This information may e.g. be used to initialize the simulation engine, to influence a compilation process with a production code compiler, or to export production code information for use in other tools/process, like e.g. calibration and measurement information in ASAP2 format (in particular a variable description file) or AUTOSAR XML information. Preferably, a documentation is generated automatically after production code generation has been finished.

In alternative embodiments, hardware-level code or a configuration for a programmable hardware device may be created from the blocks describing the control program.

Figure 4:
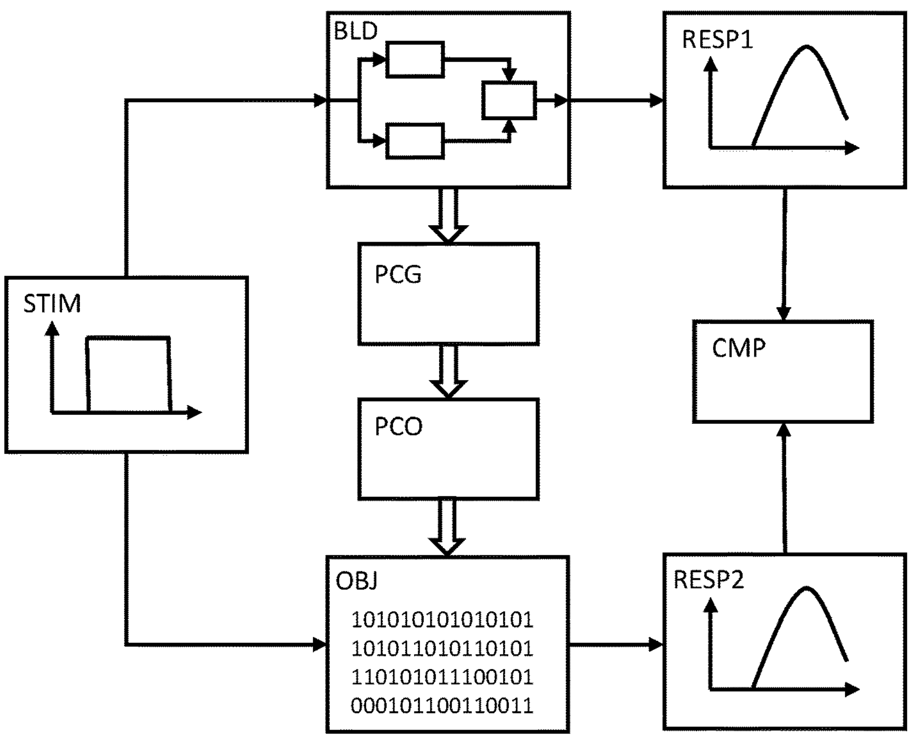
FIG. 4 is an exemplary diagram of a method for testing the compliance of the executable with a model specifying the desired behavior.

FIG. 4 displays an exemplary embodiment of a method for compiling and testing a control program.

The model editor MOD of the TCE preferably comprises a graphical user interface for modifying a block diagram BLD, which may comprise a plurality of blocks interconnected by signal paths. Each block may be an atomic block providing a specific functionality or it may represent a hierarchical block such as a subsystem, which comprise a plurality of subordinate blocks that are shown in a lower hierarchical level. Blocks may be connected by signals which may be of scalar or composite type and which can be represented by arrows indication the direction of the data flow. In the shown example, the block diagram comprises three blocks, an input port for receiving an input signal and an output port for sending an output signal. Preferably, the block diagram describes the predetermined or intended behavior of a control program. Upon activation of the simulation engine in the technical computing environment, the block diagram BLD is executed and results are calculated for each time step. The block diagram may be interpreted directly or it may be converted to an intermediate form that allows for a faster execution in the simulation engine.

Preferably, a number of test cases for the control program have been deduced from the specification and intended application of the control program. Advantageously, a test case comprises a stimulus STIM sent as an input signal to the control program and a corresponding response RESP received as an output signal from the control program. In the shown example, the stimulus STIM is represented by a diagram depicted a particular temporal behavior of the input signal. When the control program is executed in the simulation engine on the host computer, operations corresponding to the block diagram BLD are carried out for a plurality of time steps. During each time step, the current value of the stimulus STIM is fed to the appropriate input ports of the block diagram, the block diagram BLD is being executed in the simulation engine, so that signals are being manipulated and a new internal state of the model may be reached. By simulating the model given in the block diagram for a predetermined duration and by recording the output signal, a response RESP1 can be determined in a model-in-the-loop simulation. A model-in-the-loop simulation mode may be used for verifying that the block diagram executed in the simulation engine actually describes the intended behavior of the control program. All arithmetic calculations can be carried out with high-precision operations, e.g. using the floating-point data type double for the variables. As a result, the simulation is sufficiently accurate to use the recorded output signals as reference data.

Once correctness of the model has been established and reference data has been stored, the blocks corresponding to the control program are converted to program code via the production code generator PCG. The generated production code is then compiled to object code or an executable using the production code compiler PCO; an object code is binary data that contains instructions for a particular processor. When the object code is combined with additional information for the operating system of the host computer, an executable for the host computer is formed. Settings applied during the code generation may comprise a conversion to lower-precision operations that are computationally more efficient, e.g. integer instructions for fixed-point calculations, so that the control program later can be executed in real-time on the microcontroller of an embedded system.

In order to verify that the calculations of the generated code are sufficiently accurate and match the behavior of the blocks in the graphical model, a software-in-the-loop simulation or a processor-in-the-loop simulation may be carried out. The object code or the executable OBJ, which may be in the form of a DLL, contains calculations corresponding to the block diagram. During a predetermined duration, a stimulus STIM is fed to the object code or executable OBJ, and the output signals are recorded to obtain a response RESP2. Generally, multiple variables may be logged while running the simulation; this may comprise adding log macros to the program code prior to the simulation and determine a basic data type of an enumeration signal when initializing the simulation.

The response RESP1 of the model-in-the-loop simulation may be displayed on the host computer simultaneously with the response RESP2 of the generated code, so that a visual comparison may be performed by the user. Additionally or alternatively, the response RESP1 and RESP2 may be compared in a comparison tool CMP, so that a number of checks for compliance to predetermined conditions may be carried out. Preferably, the output signals are compared point by point; in particular, the absolute difference between a data point in RESP1 and the corresponding data point in RESP2 may be calculated. By comparing the differences to a threshold indicating a maximum permissible difference, the correctness of the optimizations applied when generating and compiling the code can be verified.

Figure 5:
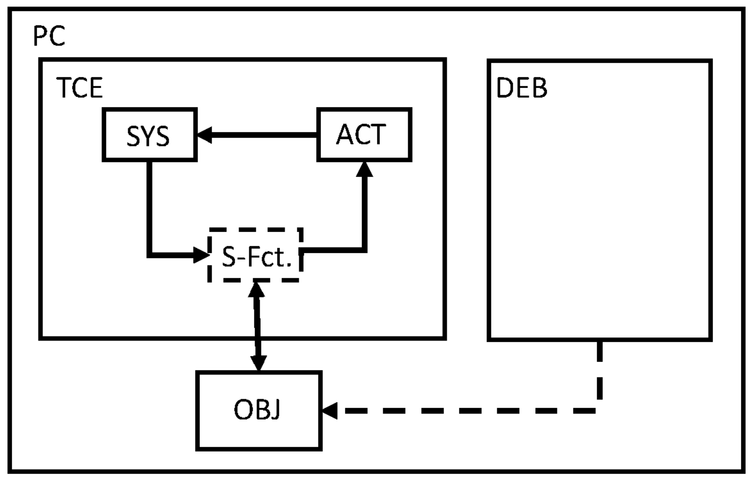
FIG. 5 is a schematic view of an exemplary embodiment of a SIL simulation.

FIG. 5 illustrates an exemplary embodiment of a software-in-the-loop simulation, i.e. a simulation for which production code is generated and compiled, the resulting executable then being run on the host computer. In a software-in-the-loop simulation, the effects of converting high-precision operations to lower-precision operations on the accuracy of the control, such as quantization errors, overflows or saturation effects, can be observed. As indicated by the outermost rectangle, the simulation is carried out by a processor of the host computer PC.

The technical computing environment TCE comprises a simulation engine for executing block diagrams; the simulation engine may in particular comprise a solver. At least one block or subsystem SYS corresponding to a model of the plant, i.e. the dynamical system to be controlled, is executed in the simulation engine. The plant model block SYS may comprise an arbitrary number of subordinate blocks. At least one signal, e.g. a sensor output, is sent from the plant model block to a communication function S-Fct., which is integrated with the simulation engine of the technical environment. In the picture, signals are represented by arrows from a sending block to a receiving block. The communication function may advantageously replace in the simulation engine the one or more blocks for which a software-in-the-loop simulation mode has been selected and provide a mechanism for exchanging signals. The communication function may be generated by the technical computing environment, in particular based on the specification of the one or more blocks with respect to input or output ports and/or signals received or sent by these blocks.

The communication Function S-Fct. provides for an exchange of signals, which may be represented by the value of a variable, with an executable OBJ that was created from the one or more selected blocks via the production code generator PCG and the production code compiler PCO. The executable OBJ containing the compiled production code may e.g. be realized as a dynamic link library in the operating system of the host computer. Input/Output signals of the executable OBJ are sent/received by the communication function and transferred from/to the simulation environment. When at least one of the exchanged signals is marked as an enumeration, the corresponding basic data type needs to be determined in order to exchange the signals during the simulation. Also, other data interesting for analysis during this testing process maybe collected and transferred from/to the executable OBJ, for example coverage data. In the shown example, the block diagram comprises an actuator model block ACT, which modifies the output signals of the executable OBJ and sends the resulting signal to the plant model SYS. As a result, a closed-loop simulation of the complete dynamical system comprising plant and controller can be performed.

The executable OBJ is external to the computing environment, and thus may be analyzed by an arbitrary debugger using mechanisms of the operating system of the host computer PC unobstructed by components of the TCE in between. In the shown example, the debugger DEB indicated as a rectangle analyzes the executable OBJ, as indicated by a dashed arrow. Thus, a software-in-the-loop simulation allows for a fast and efficient testing of the control program implemented in the production code.

Figure 6:
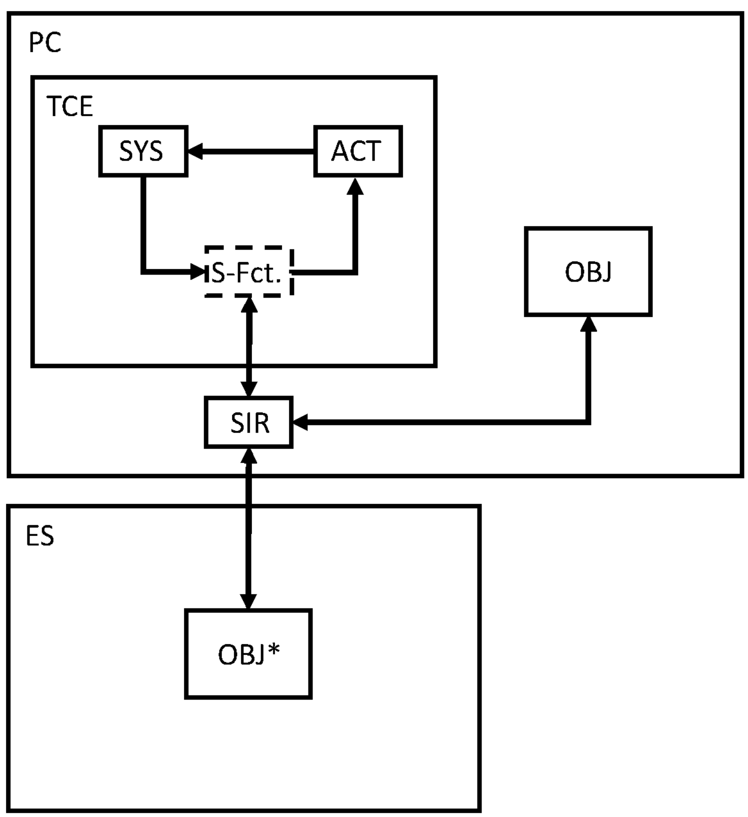
FIG. 6 is a schematic view of an exemplary embodiment of a test environment that allows for switching between a SIL simulation mode and a PIL simulation mode.

FIG. 6 displays an exemplary embodiment of a test environment that allows for switching between a software-in-the-loop simulation mode and a processor-in-the-loop simulation mode. An upper rectangle indicating the host computer PC and a lower rectangle indicating an embedded system ES are shown in the figure. The host computer PC and the embedded system ES are connected via a dedicated interface; the dedicated interface may restrict the data transfer speed, so that only a limited number of signals or corresponding variables may be exchanged without excessive slowing of the simulation and thus the debugging capabilities may be considerably limited.

As in the previous figure, the technical computing environment TCE comprises a simulation engine which executes a plant model SYS and may execute an actuator model ACT. In the shown test environment, a communication function S-Fct. is adapted to provide for an exchange of signals between the simulation engine in the TCE and the signal router SIR.

The signal router SIR allows for exchanging signals between the simulation engine and/or one or more executables; it is external to the technical computing environment, so that it uses neither the modeling environment MOD, nor the simulation engine SIM, nor the script interpreter MAT, but is only connected to the communication function S-Fct. for a transfer of signals. The signal router may be realized as a standalone executable or as a library routine, in particular a DLL, in the operating system of the host computer. When at least one of the exchanged signals is marked as an enumeration, the corresponding basic data type needs to be determined in order to exchange the signals during the simulation. The signal router may comprise a buffer and/or a logging mechanism for the one or more signals to be exchanged.

The test environment comprises a host environment for executing the control program OBJ on the host computer and a target environment for executing the control program OBJ* on the embedded system. Preferably, the signal router allows for static or on-the-fly switching between a software-in-the-loop simulation and a processor-in-the-loop simulation by redirecting the exchanged signals. Further, it is possible to simulate several subsystems or submodels in a software-in-the-loop or a processor-in-the-loop simulation mode at once by the router routing the corresponding signals for each.

When a processor-in-the-loop simulation is performed, the production code is cross-compiled on the host computer to create an executable OBJ* that is subsequently being run on another processor, in particular a microcontroller of an embedded system. In a processor-in-the-loop simulation, both the correctness of the code generator, preferably configured according to a specific set of options, and the correctness of the compiler for the target platform, preferably also configured according to a specific set of options, can be verified.

When a software-in-the-loop simulation is performed, the effect of converting high-precision operations to lower-precision operations on the accuracy of the control can be observed in order to check the correctness of the code generator. Using the mechanisms of the operating system of the host computer, a plurality of dedicated programs such as a stand-alone debugger may be interfaced to the executable OBJ for a fast and extensive analysis of the control program implemented in the production code.

Figure 7:
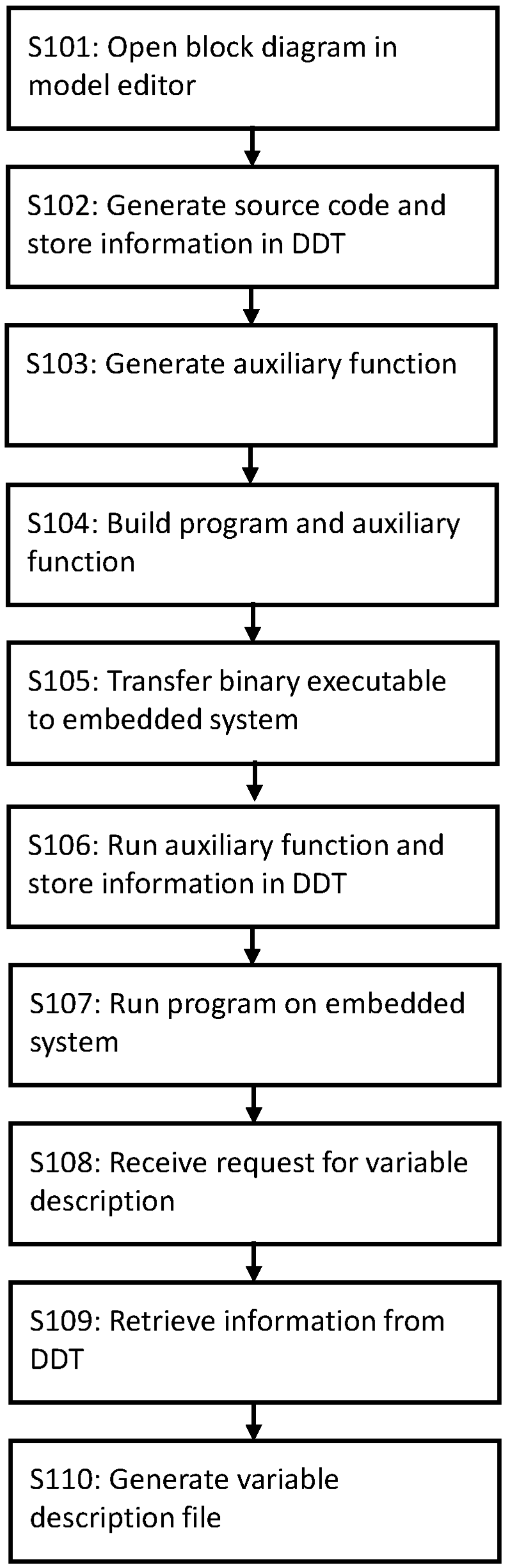
FIG. 7 is a schematic diagram of a method for generating code according to the invention.

FIG. 7 displays a schematic diagram of a method for generating code according to the invention. The method may be carried out by a processor of the host computer PC. When the host computer is equipped with a multicore processor, different software components may be run on different processor cores; also each component may make use of several processor cores for speed up of its execution.

In step S101, the processor opens the block diagram in the model editor of the technical computing environment. Opening the block diagram may comprise determining parameters of the model or converting blocks based on predefined rules.

Based on the block diagram the code generator produces source code in step S102; further, information on the generated source code, such as names and enumeration types of enumeration variables are stored in the data definition tool. When multiple enumeration variables are defined in the block diagram, the names and corresponding enumeration types are preferably stored for each defined enumeration variable.

In step S103, an auxiliary function (or an auxiliary file comprising at least one additional function) is generated based on the information in the data definition tool. The function in the auxiliary file may comprise source code such as given in the listing below:

```
void GetEnumInfo(Type, Size, Signed){
  Size = sizeof(Type);
  switch(Size){
    case 1:
      Signed = (Type) ((UInt8)INT8MAX+1) < 0;
      break;
    case 2:
      Signed = (Type) ((UInt16)INT16MAX+1) < 0;
      break;
    default:
      Signed=-1; /* value indicates an error */
    }
}
```

The expressions INT8MAX or INT16MAX refer to predefined constants denoting the biggest positive value that can be represented by an integer of 8 bit or 16 bit width (i.e. a byte width of 1 or 2 bytes).

The program is built in step S104; building the program comprises compiling the source code and linking the resulting object files to generate an executable file. The binary executable file may comprise the auxiliary function, or the auxiliary file may be compiled and linked to a standalone executable file.

The binary executable file (and, if present, the standalone executable file comprising the auxiliary function) is transferred to an embedded system connected to the host computer in step S105.

In step S106, the auxiliary function is executed and the resulting information is stored in the data definition tool on the host computer.

The program is run on the embedded system in step S107, in order to perform a processor-in-the-loop simulation.

In step S108, the processor determines that a request to generate a variable description file for the binary executable file is received. The user input may be received via a graphical user interface; alternatively, it may be received in a further file previously stored by the user.

The processor retrieves information on variables used in the program from the data definition tool in step S109. This comprises information on at least one enumeration variable for which the byte width and/or the basic data type has been determined in an auxiliary function.

In step S110, the processor generates the variable description file based on the retrieved information. The variable description file may comprises address values or address offsets for structured variables such as a C-language struct or an array comprising at least one enumeration variable. Because the variable description file has been determined on the target platform with the corresponding compiler options, the determined byte width or the determined basic data type as well as address offset values also apply to the final ECU firmware.

Those skilled in the art will appreciate that the order of at least some of the steps of the method may be changed without departing from the scope of the claimed invention. While the present invention has been described with respect to a limited number of embodiments, those skilled in the art will appreciate numerous modifications and variations therefrom. It is intended that the appended claims cover all such modifications and variations as fall within the true spirit and scope of the present invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for simulating a program, the program being modeled as one or more blocks of a block diagram in a technical computing environment, the one or more blocks comprising at least one signal or parameter that is marked as an enumeration, the technical computing environment comprising a model editor, a data definition tool and a code generator, the method being executed by at least one processor of a host computer, the method comprising:

opening the block diagram in the model editor;

generating source code for the one or more blocks of the block diagram using the code generator, including converting the at least one signal or parameter to an enumeration variable in the source code;

storing information on the source code in the data definition tool, the information comprising the defined type of the enumeration variable in the source code;

building the program from the source code using a predefined compiler in order to generate a binary executable file;

generating an auxiliary file based on the information in the data definition tool, wherein the auxiliary file is built to be a standalone binary executable file or integrated into the binary executable file of the program; and initializing a simulation by running at least one function in the auxiliary file in order to determine at least a width of a basic data type corresponding to the enumeration variable in the binary executable file, and allocating one or more variables based on the determined byte width.

2. The method of claim 1, wherein determining the byte width comprises determining whether the basic data type is signed or unsigned.

3. The method of claim 1, further comprising: storing information on the determined byte width, the determined basic data type or both in the data definition tool.

4. The method of claim 1, wherein simulating the program comprises:

executing the built program on the host computer;

logging or extracting the values of one or more of the variables of the program during execution, including at least one enumeration variable; and displaying on a display or storing in a memory the logged simulation results.

5. The method of claim 1, wherein the predefined compiler is adapted to generate instruction for a target processor differing from the processor of the host computer, wherein an embedded system comprising a target processor is connected to the host computer, wherein simulating the program comprises:

transferring the binary executable file to the embedded system;

running the binary executable file on the target processor;

logging or extracting the values of one or more of the variables of the program during execution, including at least one enumeration variable; and storing or displaying the logged values on the host computer.

6. The method of claim 1, wherein the enumeration variable is part of a structured variable, further comprising:

determining address values for accessing the different components of the structured variable, and storing the address values in the data definition tool.

7. A non-transitory computer readable medium containing instructions that, when executed by a microprocessor of a computer system, cause the computer system to carry out the method according to claim 1.

8. A computer system comprising a host computer, the host computer comprising a microprocessor, a random access memory, a graphics controller connected to a display, a serial interface connected to at least one human input device, and a nonvolatile memory, a hard disk or solid state disk, the nonvolatile memory comprising instructions that, when executed by the microprocessor, causes the computer system to carry out the method according to claim 1.

9. The computer system of claim 8, further comprising an embedded system connected to the host computer, the embedded system comprising a target processor.

10. A method for generating source code for a program, the program being modeled as one or more blocks of a block diagram in a technical computing environment, the one or more blocks of the model comprising at least one signal or parameter that is marked as an enumeration, the technical computing environment comprising a model editor, a data definition tool and a code generator, the method being executed by at least one processor of a host computer, the method comprising:

opening the block diagram in the model editor;

generating source code for the one or more blocks of the block diagram using the code generator, including converting the at least one signal or parameter to an enumeration variable in the source code;

storing information on the source code in the data definition tool, the information comprising the defined type of the enumeration variable in the source code;

building the program from the source code using a predefined compiler in order to generate a binary executable file;

generating an auxiliary file based on the information in the data definition tool, wherein the auxiliary file is built to be a standalone executable or integrated into the binary executable file of the program;

initializing a simulation by transferring the binary executable file to the embedded system and running at least one function in the auxiliary file in order to determine the width of the basic data type corresponding to the enumeration variable in the binary executable file;

storing information on the enumeration variable in the data definition tool, comprising the determined byte width or a determined basic data type or both;

simulating the program by running the binary executable file on the target processor;

receiving user input indicating that a variable description file is to be generated; and generating a variable description file for the program, the variable description file comprising information on the enumeration variable, wherein at least the determined byte width or the determined basic data type is retrieved from the data definition tool.

11. The method of claim 10, wherein the enumeration variable is part of a structured variable, further comprising:

determining address offset values for accessing the different components of the structured variable; and storing the address offset values in the variable description file.

12. The method of claim 10, wherein the at least one function in the auxiliary file is executed when initializing the simulation.

13. The method of claim 10, wherein determining the byte width comprises determining whether the basic data type is signed or unsigned.

14. The method of claim 13, wherein storing information on the enumeration variable in the data definition tool comprises storing if the basic data type is signed, an identifier of the determined basic data type or both in the data definition tool.

15. A method for simulating a program, the program being modeled as one or more blocks of a block diagram in a technical computing environment, the one or more blocks comprising at least one structured signal or parameter that comprises multiple components, the technical computing environment comprising a model editor, a data definition tool and a code generator, the method being executed by at least one processor of a host computer, comprising:

opening the block diagram in the model editor;

generating source code for the one or more blocks of the block diagram using the code generator, including converting the at least one signal or parameter to a structured variable in the source code;

storing information on the source code in the data definition tool, the information comprising the names of the components of the structured variable in the source code;

building the program from the source code using a predefined compiler in order to generate a binary executable file;

generating an auxiliary file based on the information in the data definition tool, wherein the auxiliary file is built to be a standalone binary executable file or integrated into the binary executable file of the program;

initializing a simulation by running at least one function in the auxiliary file in order to determine address offset values for the components of the structured variable in the binary executable file; and simulating the program, including accessing at least one component of the structured variable.

16. A method for generating source code for a program, the program being modeled as one or more blocks of a block diagram in a technical computing environment, the one or more blocks of the model comprising at least one structured signal or parameter that comprises multiple components, the technical computing environment comprising a model editor, a data definition tool and a code generator, the method being executed by at least one processor of a host computer, comprising:

opening the block diagram in the model editor;

generating source code for the one or more blocks of the block diagram using the code generator, including converting the at least one signal or parameter to a structured variable in the source code;

storing information on the source code in the data definition tool, the information comprising the names of the components of the structured variable in the source code;

building the program from the source code using a predefined compiler in order to generate a binary executable file;

generating an auxiliary file based on the information in the data definition tool, wherein the auxiliary file is built to be a standalone executable or integrated into the binary executable file of the program;

initializing a simulation by transferring the binary executable file to the embedded system, running at least one function in the auxiliary file in order to determine address offset values for the components of the structured variable in the binary executable file;

storing information on the structured variable in the data definition tool, comprising the determined address offset values of the components;

simulating the program by running the binary executable file on the target processor;

receiving user input indicating that a variable description file is to be generated; and generating a variable description file for the program, the variable description file comprising information on the structured variable, wherein at least the address offsets of the components are retrieved from the data definition tool.

* * * * *